(12) United States Patent
Kim et al.

(10) Patent No.: US 7,112,840 B2
(45) Date of Patent: Sep. 26, 2006

(54) SEMICONDUCTOR MEMORY DEVICE AND METHOD FOR FABRICATING THE SAME

(75) Inventors: Seo-Min Kim, Ichon-shi (KR); Cheol-Kyu Bok, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 11/317,809

(22) Filed: Dec. 22, 2005

(65) Prior Publication Data

US 2006/0134861 A1    Jun. 22, 2006

Related U.S. Application Data

(62) Division of application No. 10/749,750, filed on Dec. 30, 2003, now Pat. No. 7,012,002.

(30) Foreign Application Priority Data

Jan. 28, 2003    (KR)    ................................ 2003-5496

(51) Int. Cl.
    *H01L 27/108*    (2006.01)
(52) U.S. Cl. ................. 257/308; 257/774; 257/E27.089
(58) Field of Classification Search ................. 257/308
    See application file for complete search history.

(56) References Cited

U.S. PATENT DOCUMENTS

| 5,541,428 A | * | 7/1996 | Nagatomo | .................. 257/308 |
| 5,851,875 A | * | 12/1998 | Ping | .................... 257/E27.089 |
| 6,451,651 B1 | * | 9/2002 | Park et al. | .................. 438/253 |
| 6,479,341 B1 | * | 11/2002 | Lu | .............................. 438/239 |
| 6,621,110 B1 | * | 9/2003 | Matsuoka et al. | .......... 257/308 |

* cited by examiner

*Primary Examiner*—Chandra Chaudhari
(74) *Attorney, Agent, or Firm*—Blakely Sokoloff Taylor & Zafman

(57) ABSTRACT

The present invention relates to a semiconductor memory device and a method for fabricating the same. Particularly, the semiconductor memory device includes at least more than two capacitors to decrease the thickness of an insulation layer and increase the size of each capacitor, wherein the thickness of the insulation layer and the size of the capacitor are factors for increasing parasitic capacitance and leakage currents. Also, the two capacitors are arranged diagonally, thereby widening the width of each capacitor formed. Furthermore, in case of forming the double capacitors according to the preferred embodiment of the present invention, an additional reticle is not required to form the contact holes for each capacitor due to their inverted disposition relationship.

6 Claims, 10 Drawing Sheets

(A)    (B)

(A)    (B)

(A)    (B)

(A)    (B)

FIG. 4
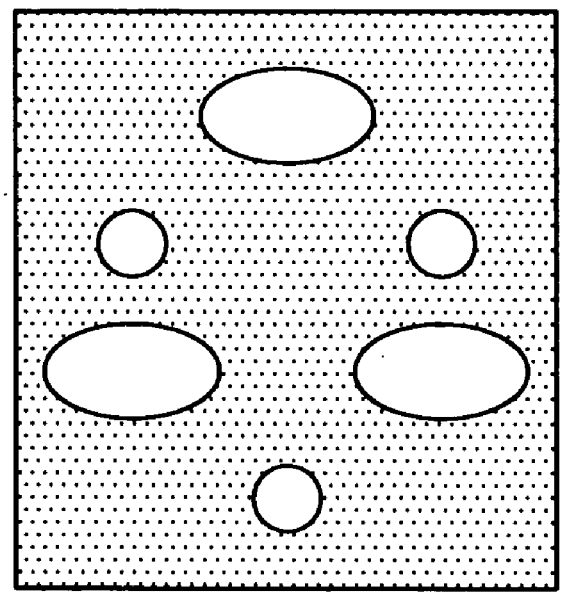
(A)
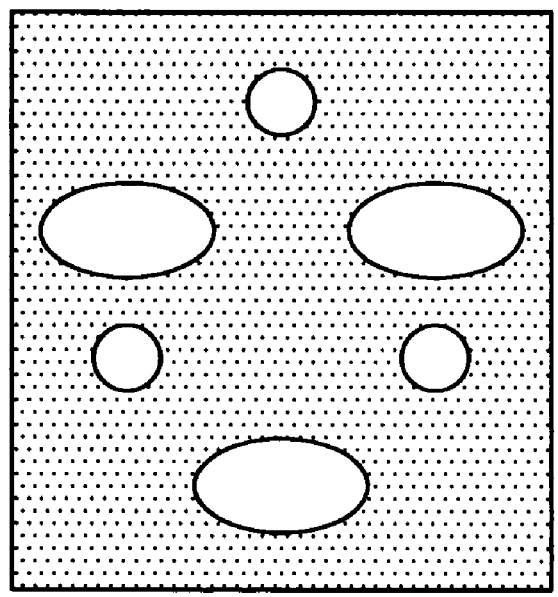
(B)

SEMICONDUCTOR MEMORY DEVICE AND METHOD FOR FABRICATING THE SAME

The present patent application is a Divisional of application No. 10/749,750, filed Dec. 30, 2003 now U.S. Pat. No. 7,012,002.

FIELD OF THE INVENTION

The present invention relates to a semiconductor memory device; and, more particularly to a capacitor of a semiconductor memory device and a method for fabricating the same.

DESCRIPTION OF RELATED ARTS

There have been made various attempts to develop a technology for securing a required capacitance as the cell size of a semiconductor device has been micronized. One of the attempts is to form a capacitor in three dimensions. Particularly, a concave-type is the most common structure of the three-dimensional capacitor.

Also, as the width of the capacitor decreases due to a decrease in the design rule of the capacitor formation, the height of the capacitor conversely increases in order to secure a maximum capacitance within a predetermined width of the capacitor. However, the increase in the capacitor height may bring out many problems FIGS. 1A to 1D are diagrams illustrating a conventional method for fabricating a capacitor of a semiconductor device. Particularly, each section (A) in FIGS. 1A to 1D is a top view of the capacitor fabricated according to the conventional method, while each section (B) in FIGS. 1A to 1D is a cross-sectional view of the capacitor in a direction of A–A' shown in each section (A).

Referring to FIG. 1A, a first inter-layer insulation layer 10 is deposited on a substrate 1 providing various elements, e.g., a transistor, and is then etched to form a plurality of plugs 11. Herein, each plug 11 is contacted to an impurity junction layer such like a source/drain or a contact pad and is particularly a contact plug by being electrically connected to a lower electrode of a capacitor. Typically, the plug 11 is made of polysilicon.

Next, a second inter-layer insulation layer 12 is formed on an entire surface of the above structure including the plugs 11. The second inter-layer insulation layer 12 is made of a silicon oxide-based material such as tetraethylorthosilicate (TEOS) or high density plasma (HDP) oxide.

In the section (A) of FIG. 1A, the four plugs 11 each having a circular shape from a top view are in a lattice arrangement, and the second inter-layer insulation layer 12 is formed thereon. Herein, the plugs 11 can be formed in other shapes like a rectangle, a polygon and an ellipse in addition to the circular shape.

Referring to FIG. 1B, a photoresist pattern 13 for defining a capacitor contact hole for a lower electrode of the capacitor is formed on the second inter-layer insulation layer 12. The photoresist pattern 13 is formed such that it opens each predetermined portion of the second inter-layer insulation layer 12 with a wider width than the width of each plug 11. Also, the photoresist pattern 13 in the section (A) of FIG. 1B has a shape allowing each predetermined portion of the second inter-layer insulation layer 12 to be opened in elliptical shape.

Referring to FIG. 1C, the second inter-layer insulation layer 12 is etched by using the photoresist pattern 13 as an etch mask to form openings, i.e., contact holes 14, each for exposing a surface of each plug 11.

At this time, the etched second inter-layer insulation layer 12 has a vertical profile when the thickness of the second inter-layer insulation layer 12 is thin. However, as the size of the contact hole 14 becomes smaller due to large-scale of integration, the height of the second inter-layer insulation layer 12 becomes higher. Therefore, the etch profile of the second inter-layer insulation layer 12 is inclined with a certain angle. Particularly, the inclined angle becomes greater as going downward to a bottom part 14B of the contact hole 14. Eventually, a capacitance decreases more than an initially expected capacitance estimated based on the size of the contact hole. Hence, the thickness of the second inter-layer insulation layer 12 is increased to form an intended contact hole by employing an advanced process. Also, in case that the thickness of the second inter-layer insulation layer 12 increases in more extents, the bottom part 14B of the contact hole 14 becomes much narrower even if a top part 14A of the contact hole 14 is formed with a certain width. As a result, the contact hole 14 may not be contacted to the plug 11.

Referring to the section (A) of FIG. 1C, the second inter-layer insulation layer 12 is opened more widely than the plug 11 in the top part 14A of the contact hole. On the other hand, in the bottom part 14B of the contact hole, the second inter-layer insulation layer 12 is opened more narrowly than the plug 11 due to the inclined etch profile.

Referring to FIG. 1D, a conductive layer 15 for use in a lower electrode, a dielectric layer 16 and a conductive layer 16 for used in an upper electrode are sequentially deposited on an entire surface of the above structure including the contact holes 14. Herein, the conductive layer 15 for use in a lower electrode and the conductive layer 16 for use in an upper electrode are referred to as the lower electrode conductive layer and the upper electrode conductive layer, respectively.

Although not illustrated, the lower electrode conductive layer 15, the dielectric layer 16 and the upper electrode conductive layer 17 are patterned to form a capacitor with a structure of the lower electrode, the dielectric layer and the upper electrode.

Also, although not illustrated, an ohmic contact and a diffusion barrier layer for preventing diffusions of a lower electrode material into the substrate 1 are formed on between the plug 11 and the lower electrode conductive layer 15. The diffusion barrier layer has a structure of $Ti/TiSi_2/TiN$.

As described above, the capacitance of the capacitor is reduced more than an intended capacitance due to the narrower bottom part of the contact hole. To solve this problem, it is possible to increase the size of the contact hole so that the thickness of the second inter-layer insulation layer decreases. However, the contact holes may become densified leaving no space of increasing the size of each contact hole, and the thickness D of the second inter-layer insulation layer located between the neighboring contact holes may become thinner if the increase in the size of the contact hole goes beyond an allowable extent. As a result, certain regions of the inter-layer insulation layer may be penetrated through, and leakage may also increase.

SUMMARY OF THE INVENTION

It is, therefore, an object of the present invention to provide a semiconductor memory device capable of increasing a capacitor capacitance.

It is another object of the present invention to provide a method for fabricating the semiconductor memory device capable of increasing a capacitor capacitance by increasing the size of a contact hole without increasing the height of an insulation layer for use in a capacitor.

In accordance with an aspect of the present invention, there is provided a semiconductor memory device, including: a plurality of plugs formed in a first inter-layer insulation layer deposited on a substrate; a second inter-layer insulation layer formed on a structure containing the plurality of the plugs; a first conductive layer electrically connected to a first group of the plugs by passing through the second inter-layer insulation layer; a first capacitor formed on a second group of the plugs adjacent to the first group of the plugs by passing through the second inter-layer insulation layer and planarized at the same plane level of the second inter-layer insulation layer and the first conductive layer; a third inter-layer insulation layer formed on a structure containing the first capacitor and the first conductive layer; a second capacitor formed on a structure containing the first conductive layer, the second capacitor electrically connected to the first conductive layer by passing through the third inter-layer insulation layer; and a second conductive layer electrically connected to the first capacitor by passing through the third inter-layer insulation layer and planarized at the same level of the second capacitor and the third inter-layer insulation layer.

In accordance with another aspect of the present invention, there is also provided a method for fabricating a semiconductor memory device, including the steps of: forming a plurality of plugs in a first inter-layer insulation layer deposited on a substrate; forming a second inter-layer insulation layer on a structure containing the plurality of the plugs; forming a first conductive layer electrically connected to a first group of the plugs by passing through the second inter-layer insulation layer; forming a first capacitor on a second group of the plugs adjacent to the first group of the plugs by passing through the second inter-layer insulation layer, the first capacitor planarized at the same level of the second inter-layer insulation layer and the first conductive layer; forming a third inter-layer insulation layer formed on a structure containing the first capacitor and the first conductive layer; forming a second capacitor electrically connected to the first conductive layer by passing through the third inter-layer insulation layer on the first conductive layer; and forming a second conductive layer electrically connected to the first capacitor by passing through the third inter-layer insulation layer, the second conductive layer planarized at the same level of the second capacitor and the third inter-layer insulation layer.

BRIEF DESCRIPTION OF THE DRAWING(S)

The above and other objects and features of the present invention will become apparent from the following description of the preferred embodiments given in conjunction with the accompanying drawings, in which:

FIGS. 3A to 3I are top views and cross-sectional views illustrating a method for fabricating capacitors of the semiconductor memory device in accordance with the preferred embodiment of the present invention; and FIG. 4 shows top views of reticles for defining regions for a first capacitor and a first conductive layer in accordance with the preferred embodiment of the present invention.

DETAILED DESCRIPTION OF THE INVENTION

Hereinafter, embodiments of a method for fabricating a semiconductor memory device will be described in more detail with reference to the accompanying drawings.

Figure 1A:
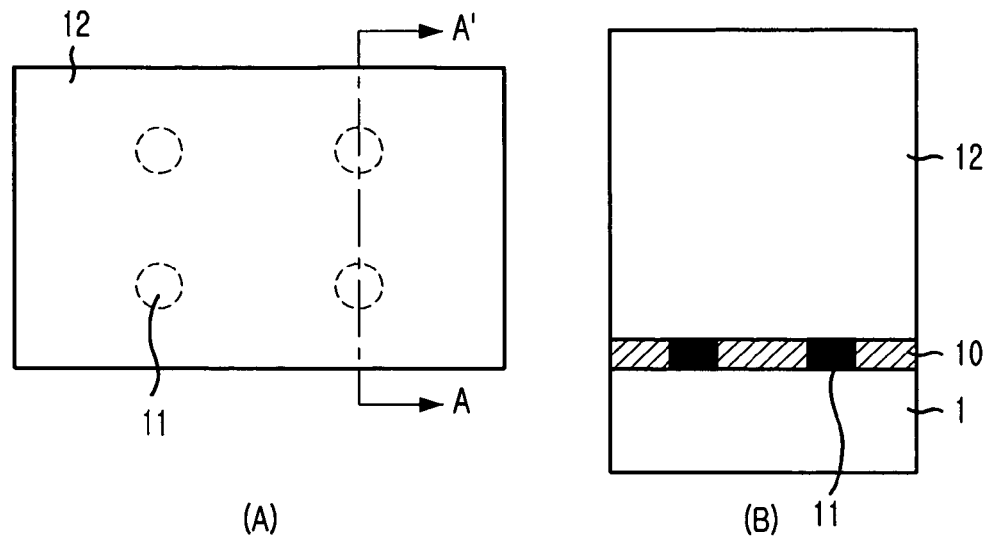
FIGS. 1A to 1D are top views and cross-sectional views illustrating a conventional method for fabricating a capacitor of a semiconductor device.
Figure 1B:
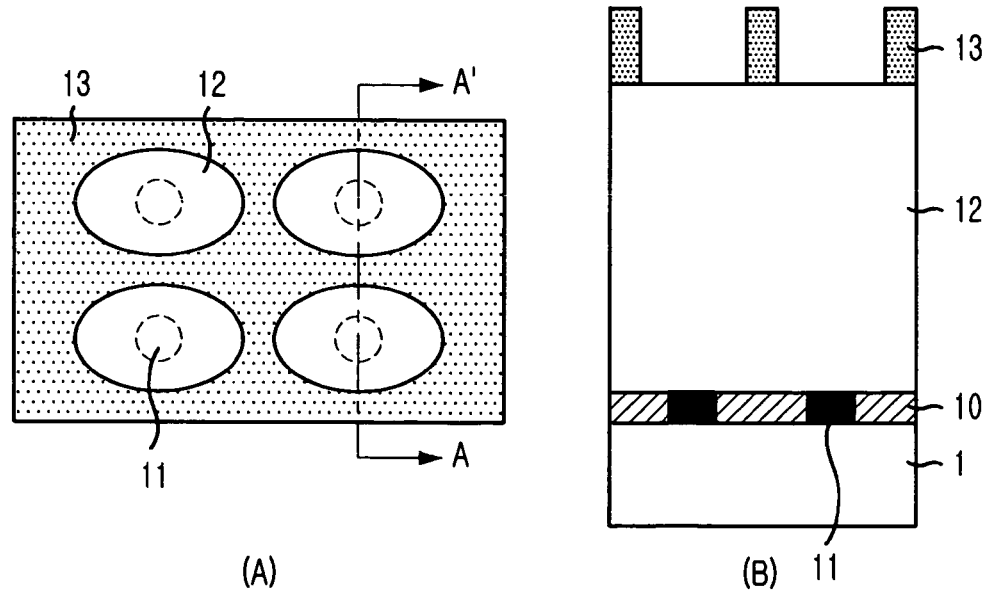
Figure 1C:
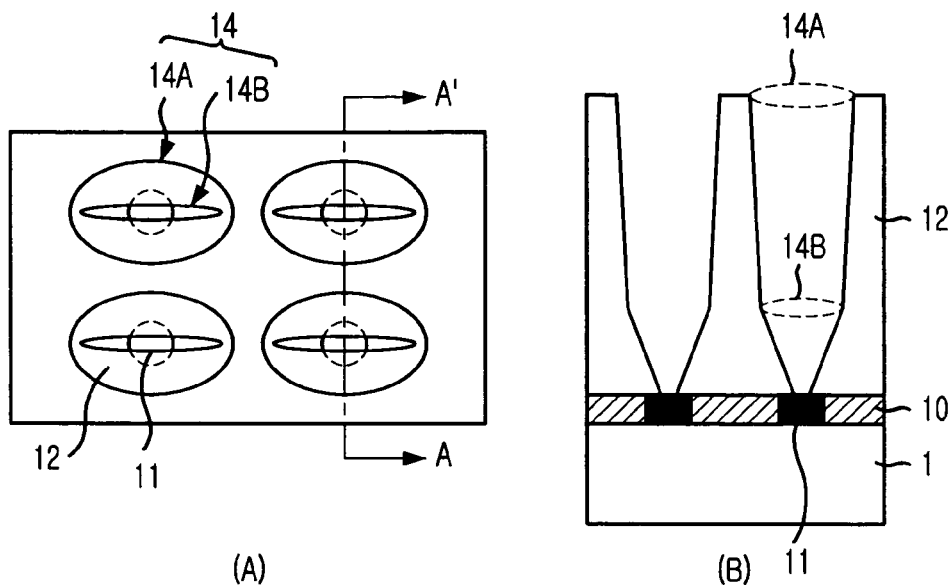
Figure 1D:
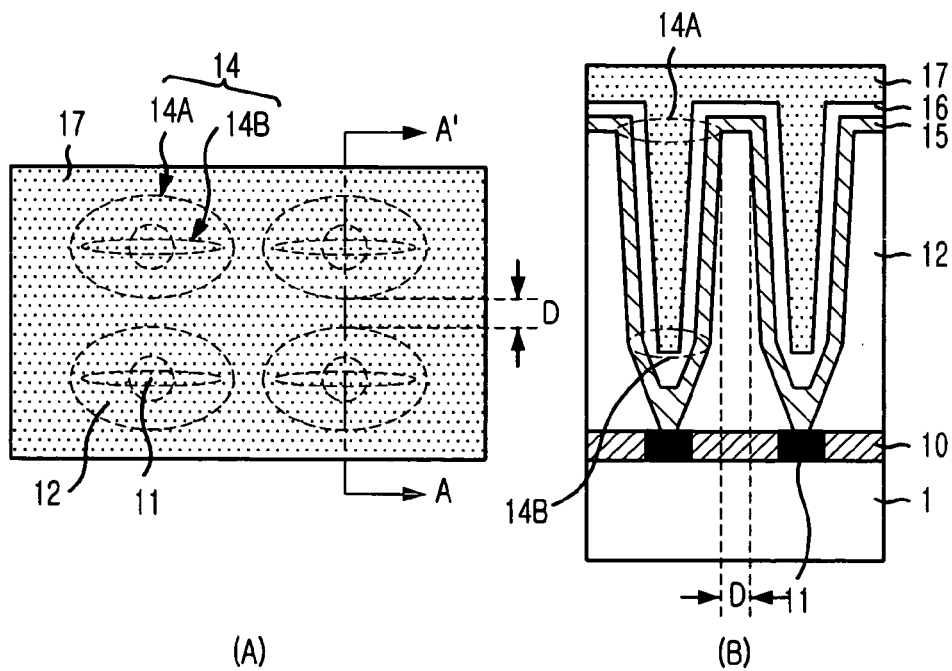
Figure 2:
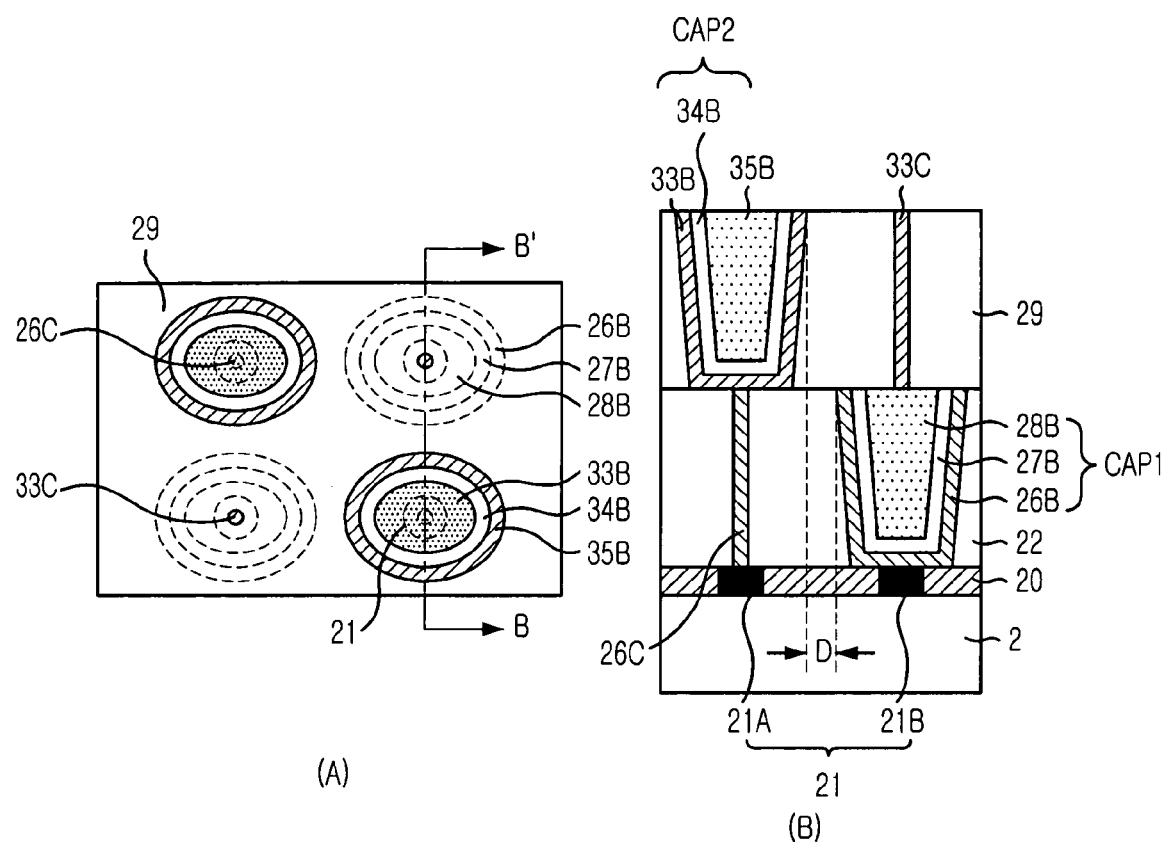
FIG. 2 shows a top view and a cross-sectional view of a semiconductor memory device in accordance with a preferred embodiment of the present invention.

FIG. 2 shows a top view and a cross-sectional view of a semiconductor memory device in accordance with a preferred embodiment of the present invention. Particularly, the section (A) of FIG. 2 is a top view of the semiconductor memory device. The section (B) of FIG. 2 is a cross-sectional view of the semiconductor memory device in a direction of the line B–B' shown in the section (A).

Referring to FIG. 2, a first inter-layer insulation layer 20 is deposited on a substrate 2 providing various elements of a semiconductor memory device such as a transistor. The first inter-layer insulation layer 20 is then etched to form a plurality of plugs 21 for making a contact with a capacitor. Thereafter, a second inter-layer insulation layer 22 is formed on the above structure containing the plurality of the plugs 21 arranged with a predetermined distance. A first conductive layer 26C is formed by passing through the second inter-layer insulation layer 22 so that the first conductive layer 26C is connected electrically to a first group of the plugs 21. Hereinafter, this first group of the plugs 21 is referred to as the first plug 21A. Meanwhile, a first capacitor Cap1 is formed by passing through the second inter-layer insulation layer 22 so that the first capacitor Cap1 is electrically connected to a second group of the plugs 21 adjacent to the first plug 21A. Hereinafter, the second group of the plugs 21 is referred to as the second plug 21B. The second inter-insulation layer 22, the first conductive layer 26C and the first capacitor Cap1 are planarized at the same plane level.

Next, a third inter-layer insulation layer 29 is formed on an entire surface of the above resulting structure including the first conductive layer 26C and the first capacitor Cap1. Then, a second capacitor Cap2 is formed on the first conductive layer 26C by passing through the third inter-layer insulation layer 29 so that the second capacitor Cap2 is electrically connected to the first conductive layer 26C. A second conductive layer 33C is formed such that it is electrically connected the first capacitor Cap1 by passing through the third inter-layer insulation layer 29. The third inter-layer insulation layer 29, the second conductive layer 33C and the second capacitor Cap2 are planarized at the same plane level.

Herein, the first capacitor Cap1 includes a first electrode 26B connected with the second plug 21B through an opening formed by etching the second inter-layer insulation layer 22, a first dielectric layer 27B formed on the first electrode 26B and a second electrode 28B formed on the first dielectric layer 27B. The second capacitor Cap2 includes a third electrode 33B connected to the first conductive layer 26C through an opening formed by etching the third inter-layer insulation layer 29, a second dielectric layer 34B formed on the third electrode 33B and a fourth electrode 35B formed on the second dielectric layer 34B.

Preferably, the first electrode 26B and the first conductive layer 26C are made of the same material. Identically, the third electrode 33B and the second conductive layer 33C are made of the same material.

The first conductive layer 26C has a width allowing its electrical connection to the first plug 21A so to prevent a poor gap-fill property, and the width of the first conductive layer 26C is smaller than that of the first capacitor Cap1. Therefore, it is possible to form the first capacitor Cap1 with the wider width.

Also, the second conductive layer 33C has a width allowing its electrical connection to the first capacitor Cap1 so to prevent a poor gap-fill property, and the width of the second conductive layer 33C is smaller than that of the second capacitor Cap2. Therefore, it is possible to form the second capacitor Cap2 with the wider width.

Herein, the distance D between the two capacitors Cap1 and Cap2 becomes narrower. However, in an actual practice, a slightly inclined etch profile is expected to be induced. Under consideration of a space E formed by the inclined etch profile, the space distance between the two capacitors Cap1 and Cap2 is D+E.

As described above, it is possible to maximally secure the size of the two capacitors Cap1 and Cap 2 allocated within a limited space. This result further makes it possible to secure an intended capacitance along with a decreased deposition thickness of the second inter-layer insulation layer 22. The decreased thickness of the second inter-layer insulation layer 22 further makes it possible to prevent the etch profile from being inclined during the first capacitor Cap1 formation.

In the section (A) of FIG. 2A, although the first capacitor Cap1, the second capacitor Cap2, the first conductive layer 26C and the second conductive layer 33C are illustrated to have circular or elliptical shapes from the top view, it is still possible for those elements to have rectangular or polygonal shapes.

Herein, the first and the second capacitors Cap1 and Cap2 and the first and the second conductive layers 26C and 33C are made of a material selected from a group consisting of Pt, Rh, Ru, Ir, Os, Pd, $PtO_x$, $RhO_x$, $RuO_x$, $IrO_x$, $OsO_x$, $PdO_x$, $CaRuO_3$, $SrRuO_3$, $BaRuO_3$, $BaSrRuO_3$, $CaIrO_3$, $SrIrO_3$, $BaIrO_3$, $(La,Sr)CoO_3$, Cu, Al, Ta, Mo, W, Au, Ag, $WSi_x$, $TiSi_x$, $MoSi_x$, $NoSi_x$, $TaSi_x$, TiN, TaN, WN, TiSiN, TiAlN, TiBN, ZrSiN, ZrAlN, MoSiN, MoAlN, TaSiN and TaAlN or an admixture of the above listed material.

Also, the first and the second dielectric layers 27B and 34B can be made of a dielectric material with a high dielectric constant K such as barium strontium titanate (BST) and $Ta_2O_5$ or a ferroelectric material such as lead zirconate titanate (PZT), strontium bismuth tantalate (SBT), strontium bismuth tantalum niobate (SBTN) and bismuth lanthanum titanate (BLT).

Hereinafter, a method for fabricating the semiconductor memory device shown in FIG. 2 will be explained in more detail.

FIGS. 3A to 3I are top views and cross-sectional views illustrating a method for fabricating the capacitors of the semiconductor memory device in accordance with the preferred embodiment of the present invention. Particularly, each section (A) of FIGS. 3A to 3I shows a top view illustrating the above method. Each section (B) of FIGS. 3A to 3I is a cross-sectional view taken in a direction of the line B-B' of the section (A).

Figure 3A:
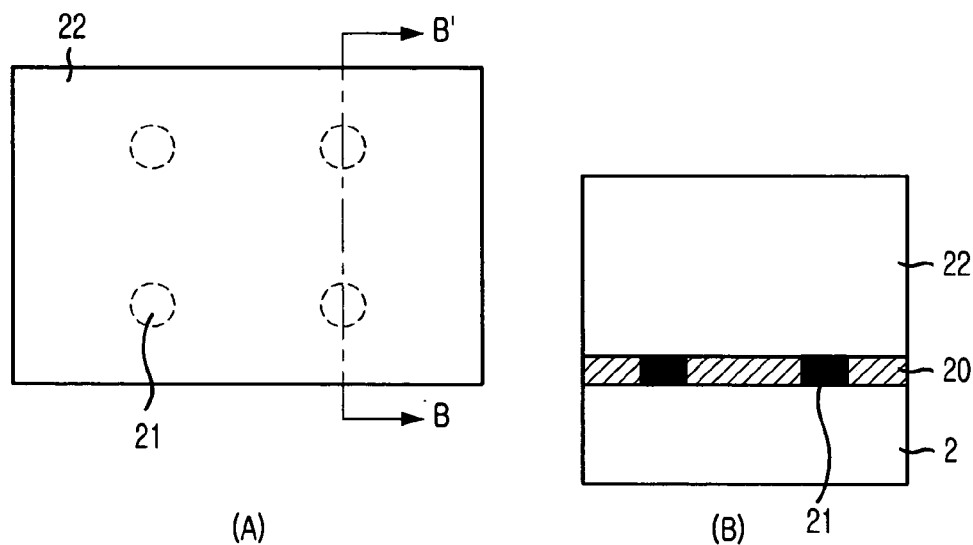

Referring to FIG. 3A, a first inter-layer insulation layer 20 is deposited on a substrate 2 providing various elements of a semiconductor memory device such as a transistor. The first inter-layer insulation layer 20 is then etched to form a plurality of the plugs 21 arranged with a predetermined distance from each other.

Herein, the plug 21 is contacted to an impurity junction layer such as a source/drain formed on the substrate 2 or to a contact pad. The plug 21 is a contact plug electrically connected to a lower electrode of a capacitor. The plug 21 is typically made of polysilicon.

Next, a second inter-layer insulation layer 22 for use in an inter-layer insulation is formed on an entire surface of the above structure including the plugs 21. The second inter-layer insulation layer 22 is preferably made of a typical silicon-based material such as tetraethylorthosilicate (TEOS) or high density plasma (HDP) oxide.

In the section (A) of FIG. 3A, the four plugs 21 each having a circular shape from a top view are in a lattice arrangement, and the second inter-layer insulation layer 22 is formed thereon. Herein, the plug 21 can be also formed in a rectangular or polygonal shape in addition to the circular or elliptical shapes.

Figure 3B:
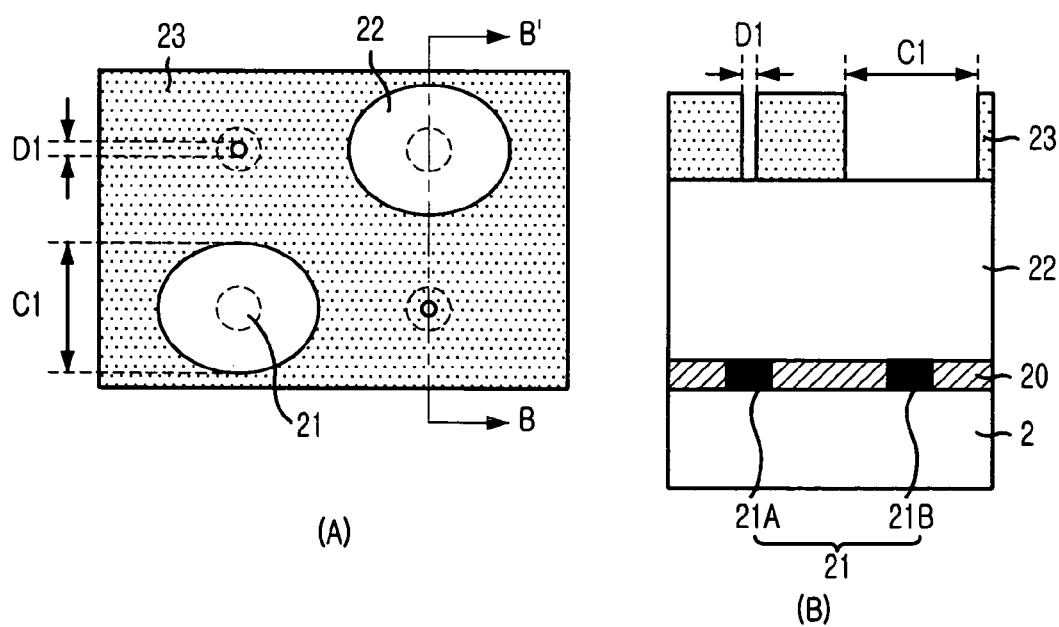

Referring to FIG. 3B, a photoresist pattern 23 for defining a capacitor contact is formed on the second inter-layer insulation layer 22. The photoresist pattern 23 has two parts: one part is for defining a D1 region for forming the first conductive layer 26C; and the other part is for defining a C1 region for forming the first capacitor Cap1. Hereinafter, the part for defining the D1 region and the other part for defining the C1 region are referred to as the D1 part and the C1 part, respectively. Particularly, the D1 part is formed in a circular shape with a width smaller than or nearly equal to the width of the first plug 21A. Also, each D1 part is arranged diagonally. The C1 part is also formed in a circular shape with a wider width than the width of the second plug 21B, and each C1 part is arranged in a crossed diagonal direction to the diagonal arrangement of the D1 parts. Herein, the photoresist pattern 23 has a shape allowing a circular opening of the second inter-layer insulation layer 22.

Figure 3C:
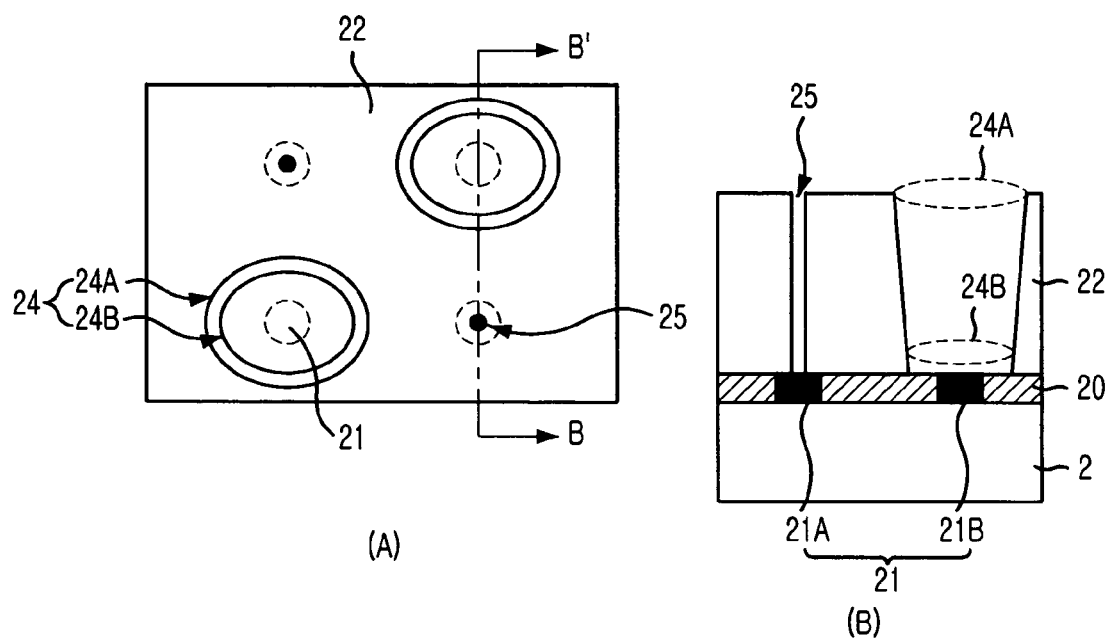

Referring to FIG. 3C, the second inter-layer insulation layer 22 is etched by using the photoresist pattern 23 as an etch mask to form openings simultaneously, i.e., a first capacitor contact hole 24 and an opening 25 for forming the first conductive layer 26C. Hereinafter, the opening 25 for forming the first conductive layer 26C is referred to as the first conductive layer opening. Also, the first capacitor contact hole 24 and the first conductive layer opening 25 expose the second plug 21B and the first plug 21A, respectively. At this time, it is possible to form the first capacitor contact hole 24 with a wider width. Thus, the deposition thickness of the second inter-layer insulation layer 22 is not necessarily to be thicker. As a result, the etched second inter-layer insulation layer 22 has a profile nearly vertical.

That is, referring to the section (A) of FIG. 3C, an upper part 24A and a bottom part 24B of the first capacitor contact hole 24 have nearly the same size and are bigger than the plug 21 so that an incidence of a contact open defect is suppressed.

Also, although the width of the first capacitor contact hole 24 is enlarged, there is not formed another capacitor contact holes adjacent to the first capacitor contact hole 24. Meanwhile, the conductive layer opening 25 of which width is much narrower than the first capacitor contact hole 24 is formed neighbored to the first capacitor contact hole 24. Thus, the first capacitor contact hole 24 does not affect other regions. Herein, in consideration of the thickness of the insulation layer 22, the conductive layer opening 25 is formed to have a width that prevents a gap-fill property problem when a conductive material for forming the conductive layer is deposited.

Figure 3D:
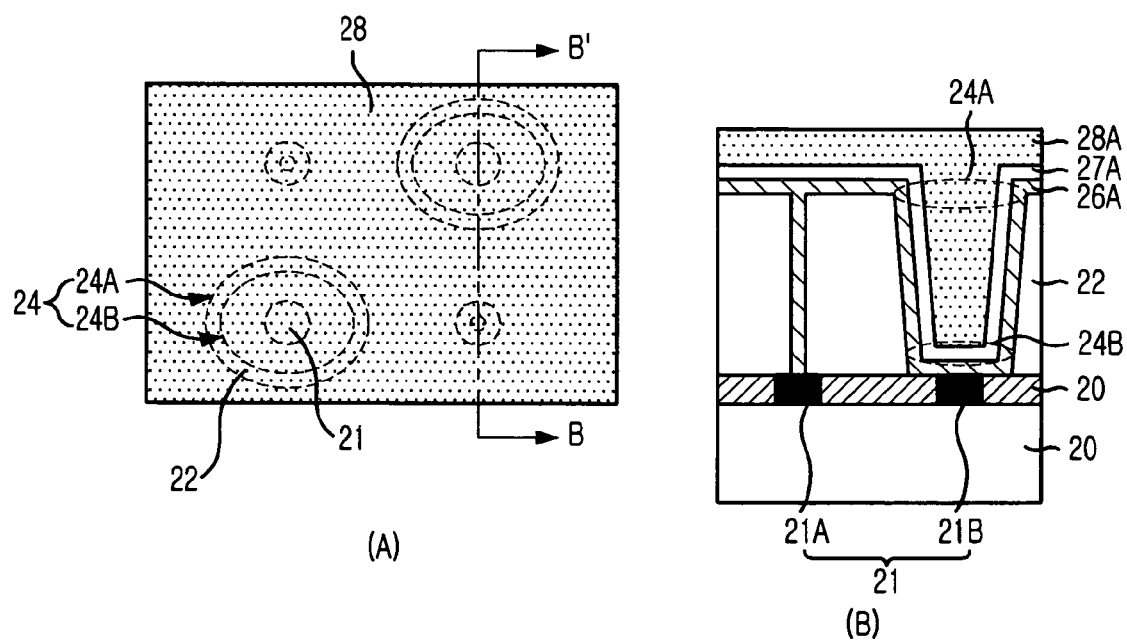

Referring to FIG. 3D, a first material 26A for forming the first conductive layer 26C and the first electrode 26B of the first capacitor Cap1, i.e., a lower electrode, is deposited along a profile containing the capacitor contact hole 24 and the conductive layer opening 25. Concurrently, the first material 26A is sufficiently filled into the conductive layer opening 25. Then, a first dielectric material 27A for forming the first dielectric layer 27B is deposited on the first material 26A, and a second material 28A for forming the second electrode 28B of the first capacitor Cap1, i.e., an upper electrode, is formed thereon.

Figure 3E:
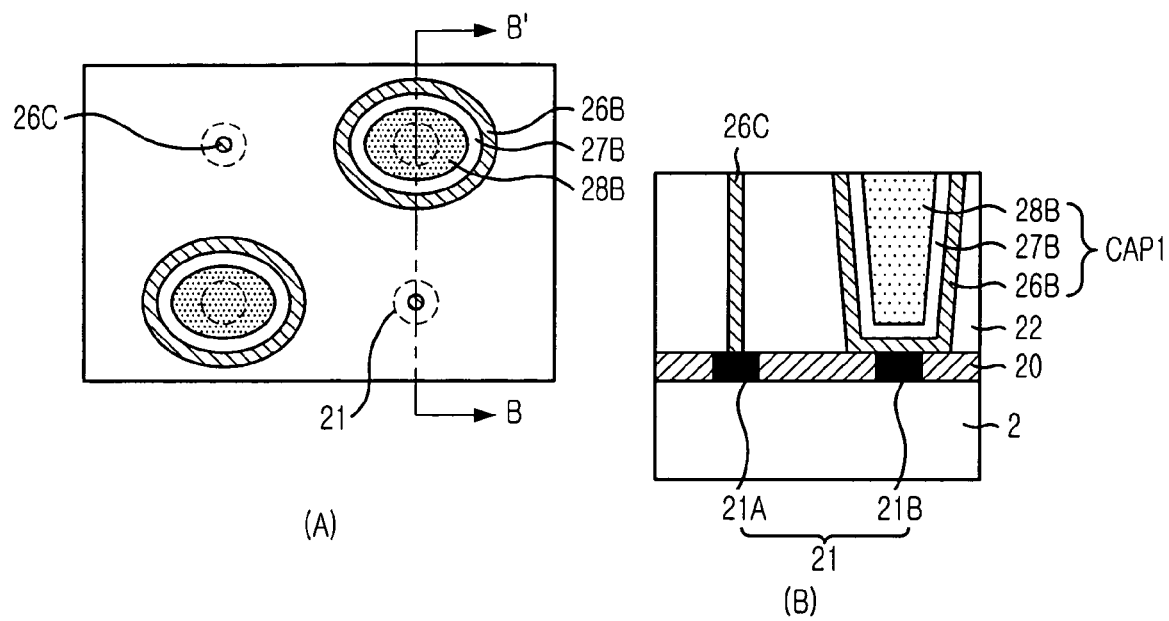

Referring to FIG. 3E, a planarization process for planarizing the second material 28A, the first dielectric material 27A and the first material 26A is performed until an upper surface of the second inter-layer insulation layer 22 is exposed. From this planarization process, the first conductive layer 26C and the first capacitor Cap1 are formed to be planarized at the same plane level. Also, the first conductive layer 26C and the first capacitor Cap1 are electrically connected to the first plug 21A and the second plug 21B, respectively by passing through the second inter-layer insulation layer 22. A chemical mechanical polishing (CMP) process or an etch-back process is an example of such planarization process.

Figure 3F:
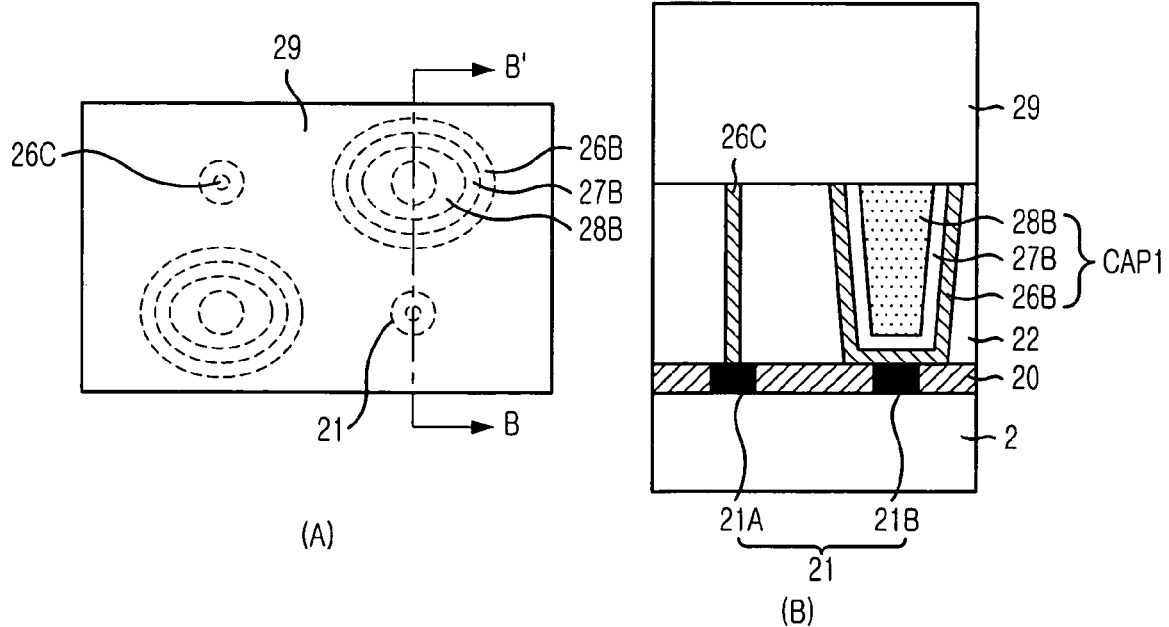

Referring to FIG. 3F, a third inter-layer insulation layer 29 is deposited on the above resulting structure. The third inter-layer insulation layer 29 is preferably made of a typical silicon-based material such as TEOS and HDP oxide.

Figure 3G:
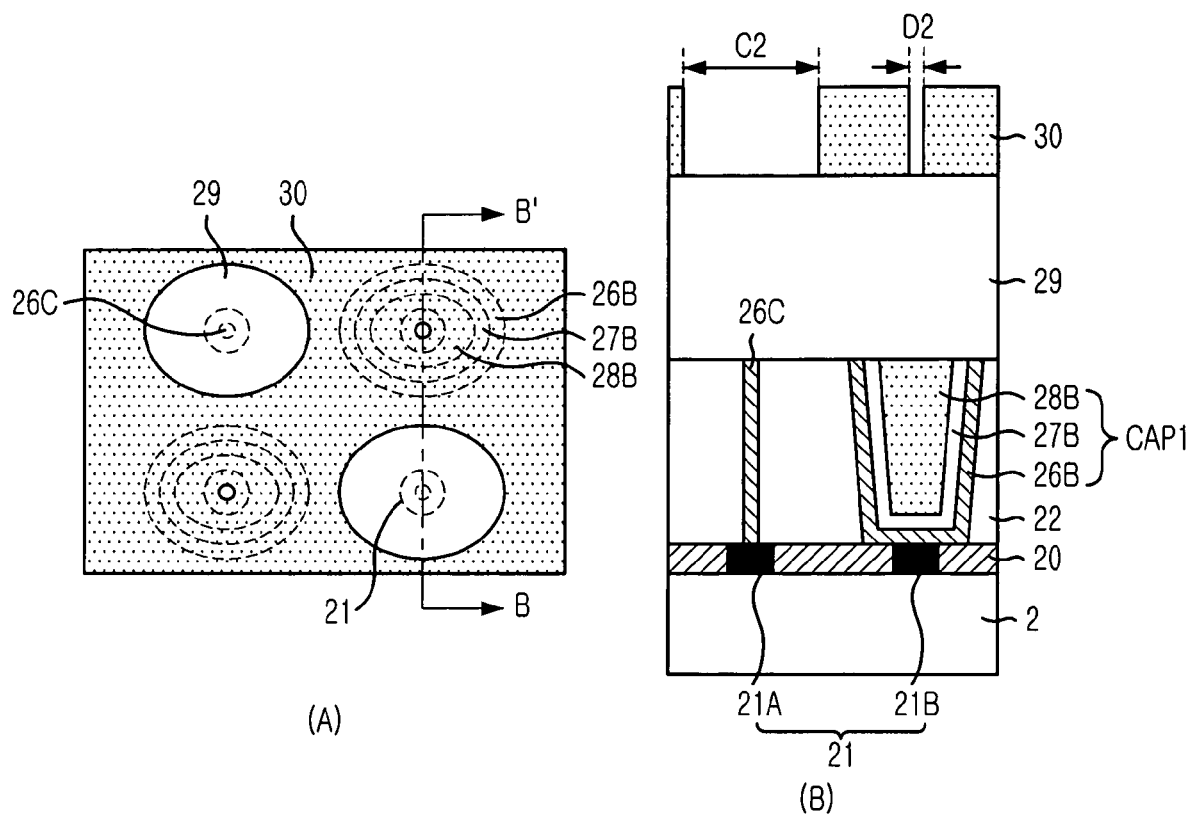

Referring to FIG. 3G, a photoresist pattern 30 for defining another capacitor contact holes is formed on the third inter-layer insulation layer 29. As shown in the section (A) of FIG. 3G, the photoresist pattern 30 includes two parts: one part is for defining a D2 region for the second conductive layer 33C electrically connected to the second electrode 28B of the first capacitor Cap1; and the other part is for defining a C2 region for the second capacitor Cap2. Hereinafter, one part for defining the D2 region and the other part for defining the C2 region are referred to as the D2 part and the C2 part, respectively. Particularly, the D2 part is formed in a circular shape with a width smaller than or nearly equal to the width of the second plug 21B. Also, each D2 part is arranged diagonally. The C2 part has a width wider than the first plug 21A, and each C2 part is arranged in a crossed diagonal direction to the diagonal arrangement of the D2 part. Herein, the photoresist pattern 30 has a circular shape so that the third inter-layer insulation layer 29 is opened in a circular shape.

Figure 3H:
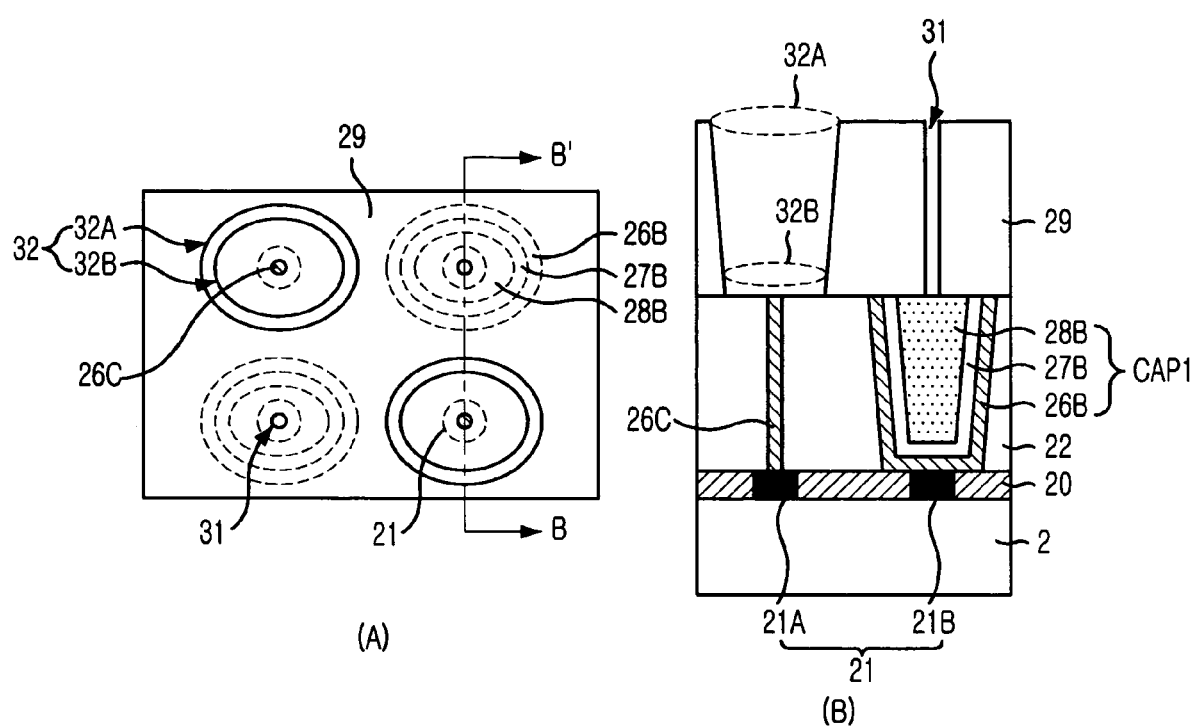
Figure 31:
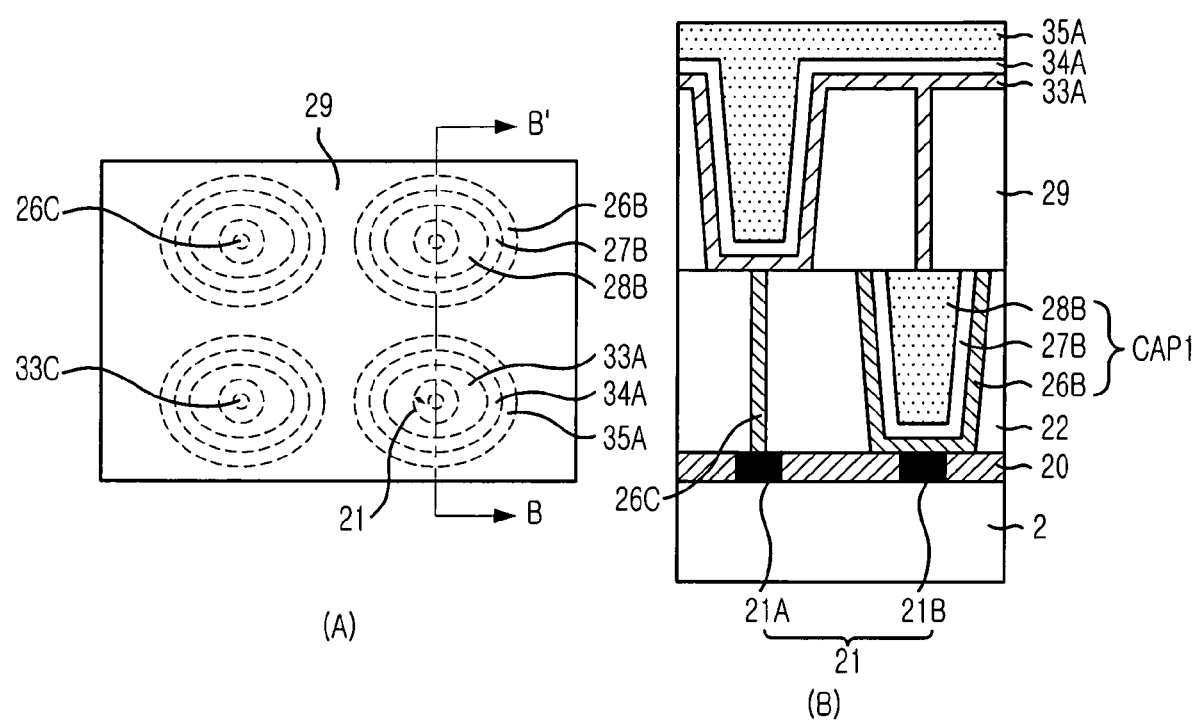

Referring to FIG. 3H, the third inter-layer insulation layer 29 is etched by using the photoresist pattern as an etch mask so to form openings, i.e., a second capacitor contact hole 32 and an opening 31 for forming the second conductive layer 33C (hereinafter referred to as the second conductive layer opening 31). Herein, the second capacitor contact hole 32 and the second conductive layer opening 31 expose surfaces of the first conductive layer 26C and the second electrode 28B of the first capacitor Cap1, respectively.

At this time, it is possible to form the second capacitor contact hole 32 with a wider width. Thus, the deposition thickness of the third inter-layer insulation layer 29 is not necessarily to be thicker, and this fact further results that the etched third inter-layer insulation layer 29 has a profile nearly vertical.

That is, referring to the section (A) of FIG. 3H, an upper part 32A and a bottom part 32B of the second capacitor contact hole 32 have nearly the same size. However, the upper part 32A and the bottom part 32B have a width wider than the width of the first conductive layer 26C so that an incidence of a contact open defect is suppressed.

Also, although the second capacitor contact hole 32 is widened, there is not formed another capacitor contact holes adjacent to the second capacitor contact hole 32. Meanwhile, the second conductive layer opening 31 of which width is much narrower than the second capacitor contact hole 32 is formed neighbored to the second capacitor contact hole 32. Thus, the second capacitor contact hole 32 does not affect other regions. Herein, in consideration of the thickness of the third inter-layer insulation layer 29, the second conductive layer opening 31 is formed to have a width that prevents a gap-fill property problem when a conductive material for forming the conductive layer is deposited.

Next, a third material 33A for forming the third electrode 33B of the second capacitor Cap2 and the second conductive layer 33C is deposited along a profile containing the second capacitor contact hole 32 by concurrently filling the second conductive layer opening 31. Thereafter, a second dielectric material 34A for forming the second dielectric layer 34B and a fourth material 35A for forming the fourth electrode 35B are sequentially deposited on the third material 33A.

Subsequently, a planarization process for planarizing the fourth material 35A, the second dielectric material 34A and the third material 33A is performed to form the second conductive layer 33C and the second capacitor Cap2 both planarized at the same plane level. At this time, the second conductive layer 33C and the second capacitor Cap2 pass through the third inter-layer insulation layer 29 and are electrically connected to the second electrode 28B of the first capacitor Cap1 and the first conductive layer 26C, respectively. A CMP process and an etch-back process are examples of the planarization process.

FIG. 4 shows top views of reticles for defining regions for the first capacitor and the first conductive layer in accordance with the preferred embodiment of the present invention.

It is possible to use a reticle as shown in the section (A) of FIG. 4 when a photo-exposure process is performed to form the first photoresist pattern 23. Also, a reticle shown in the section (B) of FIG. 4 can be used during a photo-exposure process for forming the second photoresist pattern 30. Particularly, the reticle shown in the section (B) of FIG. 4 is obtained by inverting the reticle shown in the section (A) of FIG. 4. Thus, an additional and separate reticle is not required for the photo-exposure process for forming the first and the second photoresist patterns 23 and 30.

The above described preferred embodiment of the present invention provides advantages as the following.

Firstly, because of large-scale of integration, a bottom area of a capacitor cannot be easily secured. Thus, the thickness of an insulation layer needs to be increased. However, it is difficult to apply an etching process to this thickened insulation layer. Hence, yields of devices also decrease. Thus, in the preferred embodiment of the present invention, at least more than two capacitors are formed to decrease the thickness of the insulation layer and increase the size of each capacitor. As a result, it is possible to secure an intended capacitor capacitance even under the decreased thickness of the insulation layer.

Secondly, during a photo-exposure process, a capacitor contact hole is formed with the maximum size to compensate a lowered capacitance. In this case, a space between the capacitor contact holes becomes narrowed. The narrowed space between the contact holes becomes a factor for increasing current leakages and a parasitic capacitance. However, in the preferred embodiment of the present invention, the space between the capacitors is widened, and the capacitors are arranged diagonally. As a result, it is possible to reduce the parasitic capacitance.

Thirdly, in case of forming the double capacitors as shown in the preferred embodiment of the present invention, an additional reticle is not required to form the contact holes for each capacitor due to their inverted disposition relationship, and thereby reducing a required cost for forming another reticle.

Based on these effects, it is further possible to increase yields of semiconductor memory devices.

While the present invention has been described with respect to certain preferred embodiments, it will be apparent to those skilled in the art that various changes and modifications may be made without departing from the scope of the invention as defined in the following claims.

What is claimed is:

1. A semiconductor memory device, comprising:
    a plurality of plugs formed in a first inter-layer insulation layer deposited on a substrate;
    a second inter-layer insulation layer formed on a structure containing the plurality of the plugs;
    a first conductive layer electrically connected to a first group of the plugs by passing through the second inter-layer insulation layer;
    a first capacitor formed on a second group of the plugs adjacent to the first group of the plugs by passing through the second inter-layer insulation layer and planarized at the same plane level of the second inter-layer insulation layer and the first conductive layer;
    a third inter-layer insulation layer formed on a structure containing the first capacitor and the first conductive layer;
    a second capacitor formed on a structure containing the first conductive layer, the second capacitor electrically connected to the first conductive layer by passing through the third inter-layer insulation layer; and
    a second conductive layer electrically connected to the first capacitor by passing through the third inter-layer insulation layer and planarized at the same level of the second capacitor and the third inter-layer insulation layer.

2. The semiconductor memory device as recited in claim 1, wherein the first capacitor has a width wider than the width of the first conductive layer and the second capacitor has a width wider than the width of the second conductive layer.

3. The semiconductor memory device as recited in claim 1, wherein the first capacitor includes a first electrode formed on each surface of the first group of the plugs, a first dielectric layer formed on the first electrode and a second electrode formed on the first dielectric layer and the first conductive layer is made of the same material used in the first electrode.

4. The method as recited in claim 1, wherein the second capacitor includes a third electrode formed on the first conductive layer, a second dielectric layer formed on the third electrode and a fourth electrode formed on the second dielectric layer and the second conductive layer is made of the same material used in the third electrode.

5. The method as recited in claim 1, wherein the first capacitor and the second capacitor have a circular or polygonal shape from a top view.

6. The method as recited in claim 1, wherein the first conductive layer and the second conductive layer have a circular or polygonal shape from a top view.

* * * * *